(12) United States Patent
Oganesian

(10) Patent No.: US 8,432,011 B1
(45) Date of Patent: Apr. 30, 2013

(54) WIRE BOND INTERPOSER PACKAGE FOR CMOS IMAGE SENSOR AND METHOD OF MAKING SAME

(75) Inventor: Vage Oganesian, Sunnyvale, CA (US)

(73) Assignee: Optiz, Inc., Palo Alto, CA (US)

( * ) Notice: Subject to any disclaimer, the term of this patent is extended or adjusted under 35 U.S.C. 154(b) by 21 days.

(21) Appl. No.: 13/312,826

(22) Filed: Dec. 6, 2011

(51) Int. Cl.
*H01L 31/0232* (2006.01)

(52) U.S. Cl.
USPC ........... 257/432; 257/415; 257/431; 257/440; 257/444; 438/26; 438/34; 438/109; 438/149

(58) Field of Classification Search .................. None
See application file for complete search history.

(56) References Cited

U.S. PATENT DOCUMENTS

| | | | |
|---|---|---|---|
| 6,777,767 B2 | 8/2004 | Badehi | |
| 6,972,480 B2 | 12/2005 | Zilber et al. | |
| 7,033,664 B2 | 4/2006 | Zilber et al. | |
| 7,157,742 B2 | 1/2007 | Badehi | |
| 7,192,796 B2 | 3/2007 | Zilber et al. | |
| 7,265,440 B2 | 9/2007 | Zilber et al. | |
| 7,495,341 B2 | 2/2009 | Zilber et al. | |
| 7,642,629 B2 | 1/2010 | Zilber et al. | |
| 7,859,033 B2 | 12/2010 | Brady | |
| 2004/0251525 A1 | 12/2004 | Zilber | |
| 2005/0104179 A1 | 5/2005 | Zilber | |
| 2005/0205977 A1 | 9/2005 | Zilber | |
| 2007/0138498 A1 | 6/2007 | Zilber | |
| 2007/0190691 A1 | 8/2007 | Humpston | |
| 2007/0190747 A1 | 8/2007 | Humpston | |
| 2008/0012115 A1 | 1/2008 | Zilber | |
| 2008/0017879 A1 | 1/2008 | Zilber | |
| 2008/0083976 A1 | 4/2008 | Haba | |
| 2008/0083977 A1 | 4/2008 | Haba | |
| 2008/0099900 A1 | 5/2008 | Oganesian | |
| 2008/0099907 A1 | 5/2008 | Oganesian | |
| 2008/0116544 A1 | 5/2008 | Grinman | |
| 2008/0116545 A1 | 5/2008 | Grinman | |
| 2008/0150121 A1 | 6/2008 | Oganesian | |
| 2008/0246136 A1 | 10/2008 | Haba | |
| 2009/0115047 A1 | 5/2009 | Haba | |
| 2009/0160065 A1 | 6/2009 | Haba | |
| 2009/0212381 A1 | 8/2009 | Crisp | |
| 2010/0053407 A1 | 3/2010 | Crisp | |
| 2010/0225006 A1 | 9/2010 | Haba | |

(Continued)

OTHER PUBLICATIONS

U.S. Appl. No. 13/157,193, filed Jun. 9, 2011, Oganesian, Vage.

(Continued)

*Primary Examiner* — Kyoung Lee
(74) *Attorney, Agent, or Firm* — DLA Piper LLP (US)

(57) ABSTRACT

An image sensor package that includes a handler assembly having a crystalline handler with a cavity formed into its first surface. The cavity has a stepped sidewall that defines at least one step surface extending inwardly inside the cavity. A plurality of conductive elements each extend from the step surface(s), through the crystalline handler and to its second surface. A sensor chip is disposed in the cavity and includes a substrate, a plurality of photo detectors formed at its front surface, and a plurality of contact pads formed at its front surface which are electrically coupled to the photo detectors. A plurality of wires each extend between and electrically connect one of the contact pads and one of the conductive elements. A substrate is disposed over the cavity and mounted to the crystalline handler. The substrate is optically transparent to at least one range of light wavelengths.

26 Claims, 9 Drawing Sheets

U.S. PATENT DOCUMENTS

| | | |
|---|---|---|
| 2010/0230812 A1 | 9/2010 | Oganesian |
| 2010/0237452 A1 | 9/2010 | Hagiwara et al. |
| 2011/0012259 A1 | 1/2011 | Grinman |
| 2011/0031629 A1 | 2/2011 | Haba |
| 2011/0033979 A1 | 2/2011 | Haba |
| 2011/0049696 A1 | 3/2011 | Haba |
| 2011/0108940 A1* | 5/2011 | Huang et al. ............ 257/447 |
| 2011/0187007 A1 | 8/2011 | Haba |
| 2012/0018863 A1 | 1/2012 | Oganesian |
| 2012/0018868 A1 | 1/2012 | Oganesian |
| 2012/0018893 A1 | 1/2012 | Oganesian |
| 2012/0018894 A1 | 1/2012 | Oganesian |
| 2012/0018895 A1 | 1/2012 | Oganesian |
| 2012/0020026 A1 | 1/2012 | Oganesian |
| 2012/0068327 A1 | 3/2012 | Oganesian |
| 2012/0068330 A1 | 3/2012 | Oganesian |
| 2012/0068351 A1 | 3/2012 | Oganesian |
| 2012/0068352 A1 | 3/2012 | Oganesian et al. |

OTHER PUBLICATIONS

U.S. Appl. No. 13/157,202, filed Jun. 9, 2011, Oganesian, Vage.
U.S. Appl. No. 13/157,207, filed Jun. 9, 2011, Oganesian, Vage.
U.S. Appl. No. 13/186,357, filed Jul. 19, 2011, Oganesian, Vage.
U.S. Appl. No. 13/225,092, filed Sep. 2, 2011, Oganesian, Vage.
U.S. Appl. No. 13/301,683, filed Nov. 21, 2011, Oganesian, Vage.
U.S. Appl. No. 13/343,682, filed Jan. 4, 2012, Oganesian, Vage.
U.S. Appl. No. 13/427,604, filed Mar. 22, 2012, Oganesian, Vage.
U.S. Appl. No. 13/356,328, filed Jan. 23, 2012, Oganesian, Vage.
U.S. Appl. No. 13/468,632, filed May 10, 2012, Oganesian, Vage.
U.S. Appl. No. 13/559,510, filed Jul. 26, 2012, Oganesian, Vage.
U.S. Appl. No. 13/423,045, filed Mar. 16, 2012, Oganesian, Vage.
U.S. Appl. No. 13/609,002, filed Sep. 10, 2012, Oganesian, Vage.
U.S. Appl. No. 13/157,193, filed Jun. 2011, Oganesian.

* cited by examiner

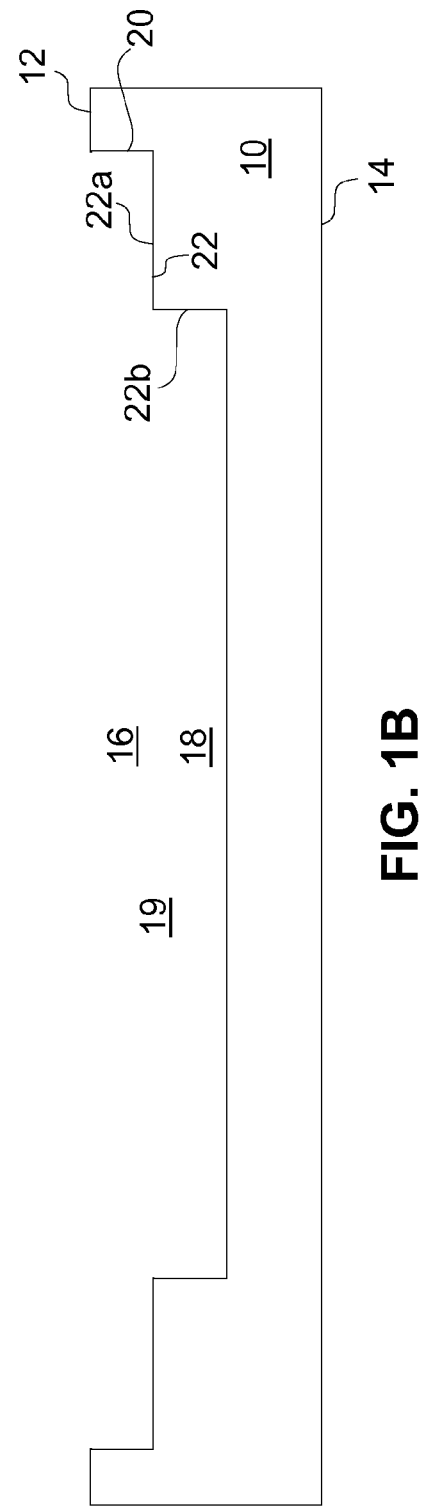

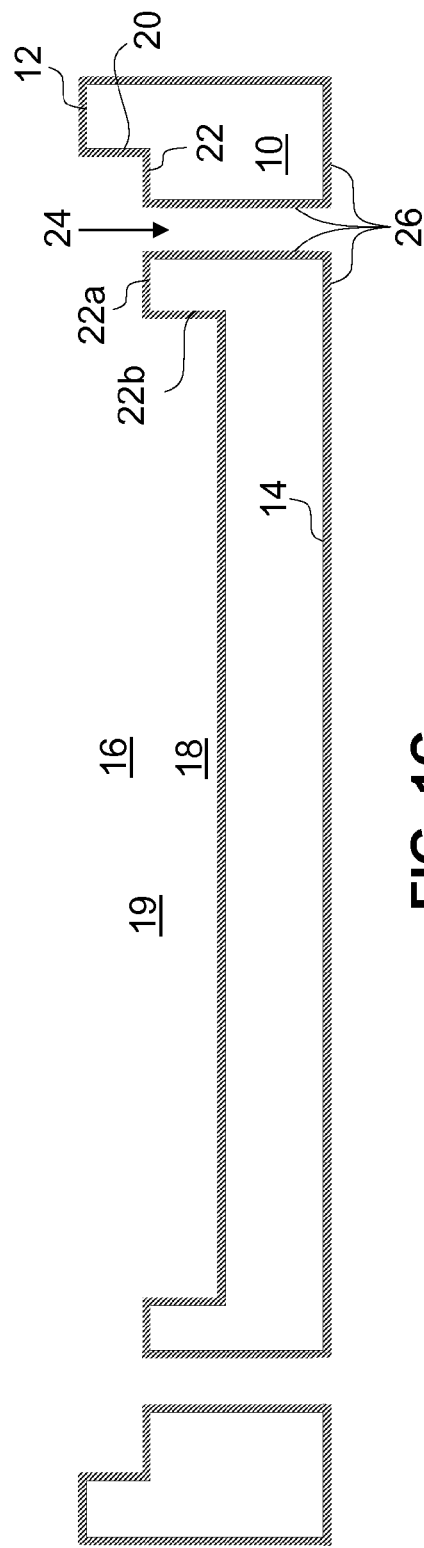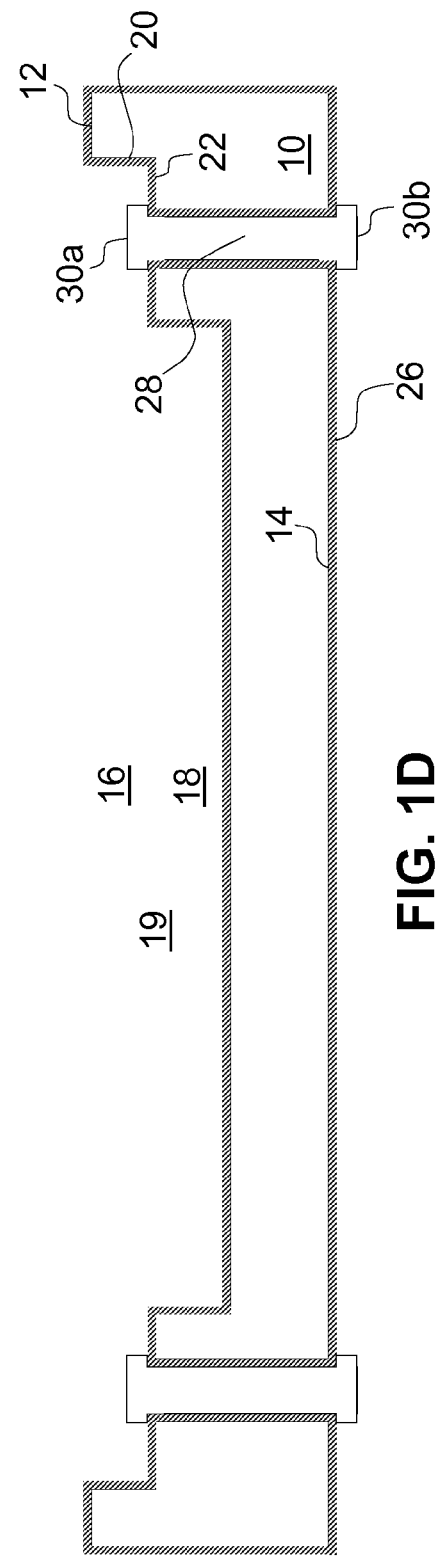
FIG. 1C
FIG. 1D

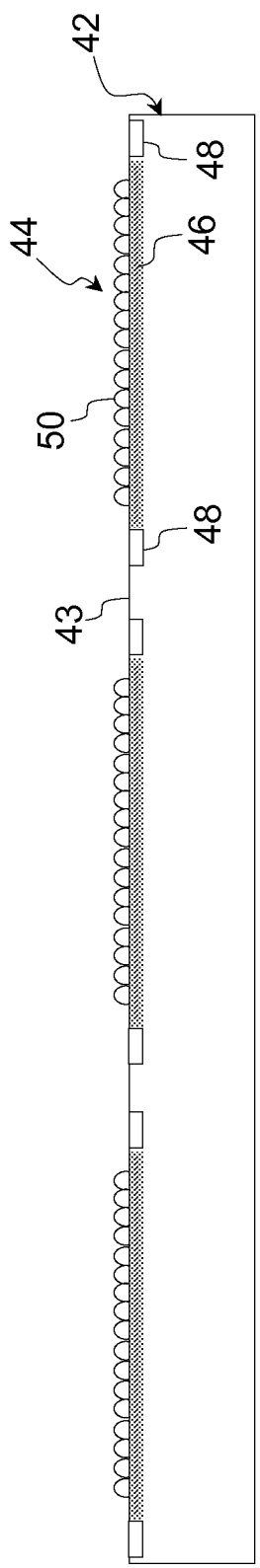
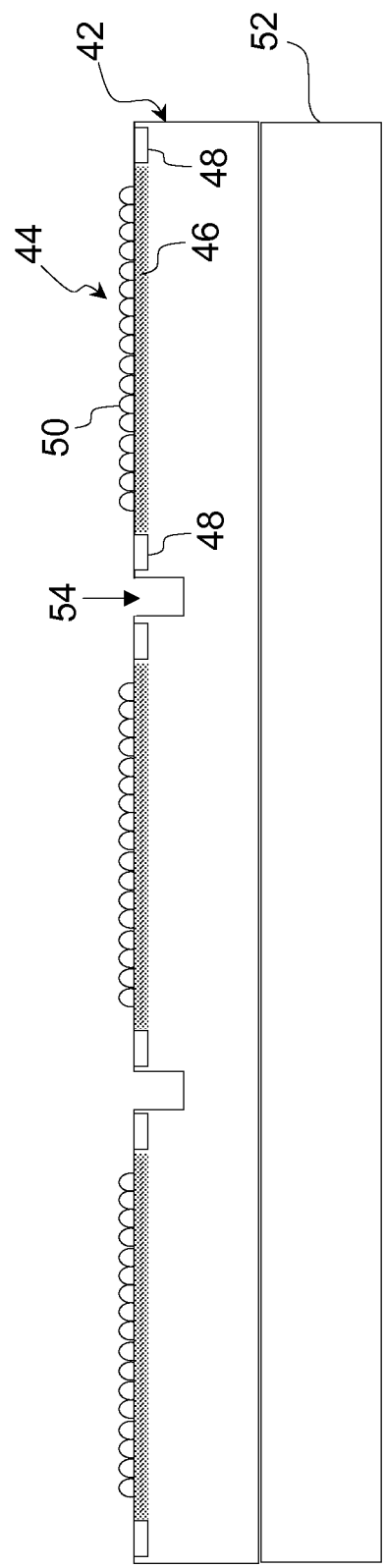
FIG. 2A
FIG. 2B

WIRE BOND INTERPOSER PACKAGE FOR CMOS IMAGE SENSOR AND METHOD OF MAKING SAME

FIELD OF THE INVENTION

The present invention relates to packaging of microelectronic devices, and more particularly to a packaging of optical semiconductor devices.

BACKGROUND OF THE INVENTION

The trend for semiconductor devices is smaller integrated circuit (IC) devices (also referred to as chips), packaged in smaller packages (which protect the chip while providing off chip signaling connectivity). One example are image sensors, which are IC devices that include photo-detectors which transform incident light into electrical signals (that accurately reflect the intensity and color information of the incident light with good spatial resolution).

There are different driving forces behind the development of wafer level packaging solutions for image sensors. For example, reduced form factor (i.e. increased density for achieving the highest capacity/volume ratio) overcomes space limitations and enables smaller camera module solutions. Increased electrical performance can be achieved with shorter interconnect lengths, which improves electrical performance and thus device speed, and which strongly reduces chip power consumption. Heterogeneous integration allows for the integration of different functional layers (e.g. the integration of high and low resolution images sensors, the integration of the image sensor with its processor, etc.). Cost reductions per unit packaging can be achieved by packaging only those chips that are known to be good (i.e. only packaging Known Good Dies—KGD).

Presently, chip-on-board (COB—where the bare chip is mounted directly on a printed circuit board) and Shellcase Wafer Level CSP (where the wafer is laminated between two sheets of glass) are the dominant packaging and assembly processes used to build image sensor modules (e.g. for mobile device cameras, optical mice, etc.). However, as higher pixel image sensors are used, COB and Shellcase WLCSP assembly becomes increasingly difficult due to assembly limitations, size limitations (the demand is for lower profile devices), yield problems and the capital investment for packaging 8 and 12 inch image sensor wafers. For example, the Shellcase WLCSP technique involves packaging the image sensors on the wafer before the wafer is singulated into separate packaged chips, meaning that those chips from each wafer that are defective are still packaged before they can be tested (which drives up the cost). Additionally, standard WLP packages are fan-in packages, in which chip area is equal to the package area, thus limiting the number of I/O connections. Lastly, standard WLP package are bare die packages, which can be complex in test handling, assembly and SMT.

There is a need for an improved package and packaging technique for chips such as image sensor chips that have already been singulated and tested, and provide a low profile packaging solution that is cost effective and reliable (i.e. provides the requisite mechanical support and electrical connectivity).

BRIEF SUMMARY OF THE INVENTION

In one aspect of the present invention, an image sensor package comprises a handler assembly, a sensor chip and a substrate. The handler assembly includes a crystalline handler having opposing first and second surfaces, wherein the crystalline handler includes a cavity formed into the first surface such that the cavity has a stepped sidewall that defines at least one step surface extending inwardly inside the cavity, and a plurality of conductive elements each extending from the at least one step surface, through the crystalline handler, to the second surface. The sensor chip is disposed in the cavity and includes a substrate with front and back opposing surfaces, a plurality of photo detectors formed at the front surface, and a plurality of contact pads formed at the front surface which are electrically coupled to the photo detectors. A plurality of wires each extend between and electrically connect one of the contact pads and one of the conductive elements. The substrate is disposed over the cavity and mounted to the crystalline handler, wherein the substrate is optically transparent to at least one range of light wavelengths.

Another aspect of the present invention is a method of packaging a sensor chip which includes a substrate with front and back opposing surfaces, a plurality of photo detectors formed at the front surface, and a plurality of contact pads formed at the front surface which are electrically coupled to the photo detectors. The method comprises providing a crystalline handler having opposing first and second surfaces, forming a cavity into the first surface such that the cavity has a stepped sidewall that defines at least one step surface extending inwardly inside the cavity, forming a plurality of conductive elements each extending from the at least one step surface, through the crystalline handler, to the second surface, inserting the sensor chip in the cavity, affixing a plurality of wires between the sensor chip and the plurality of conductive elements such that each of the wires extends between and electrically connects one of the contact pads and one of the conductive elements, and mounting a substrate to the crystalline handler such that the substrate is disposed over the cavity, wherein the substrate is optically transparent to at least one range of light wavelengths.

Yet another aspect of the present invention is a method of forming a plurality of image sensor packages by providing a crystalline handler having opposing first and second surfaces, forming a plurality of cavities into the first surface such that each of the cavities has a stepped sidewall that defines at least one step surface extending inwardly inside the cavity, for each of the cavities forming a plurality of conductive elements each extending from the at least one step surface, through the crystalline handler, to the second surface, inserting a sensor chip in each of the cavities (wherein each of the sensor chips includes a substrate with front and back opposing surfaces, a plurality of photo detectors formed at the front surface, and a plurality of contact pads formed at the front surface which are electrically coupled to the photo detectors), for each of the respective sensor chips and cavities affixing a plurality of wires between the sensor chip and the plurality of conductive elements such that each of the wires extends between and electrically connects one of the contact pads and one of the conductive elements, mounting a substrate to the crystalline handler such that the substrate is disposed over the cavities, wherein the substrate is optically transparent to at least one range of light wavelengths, and cutting the crystalline handler and substrate to form separate packages each including one of the cavities and one of the sensor chips therein.

Other objects and features of the present invention will become apparent by a review of the specification, claims and appended figures.

BRIEF DESCRIPTION OF THE DRAWINGS

FIGS. 1A-1E are cross sectional side views showing in sequence the steps in forming the handler assembly.

FIGS. 2A-2D are cross sectional side views showing in sequence the steps in singulating the image sensor chips.

DETAILED DESCRIPTION OF THE INVENTION

The present invention is a packaging of microelectronic devices, and image sensors in particular. This invention exploits the modularity of its components to increase yield, reduce cost and improve pass rate. There are three main components to the packaging design, which are formed using wafer level technologies:

1. Handler assembly 2 with preformed electrical circuitry.
2. Singulated image sensor chip 4.
3. Optically transparent substrate 60.

Each component is made separately, kept separately and tested separately. Only known good components are allowed for the integration of the package.

Figure 1E:
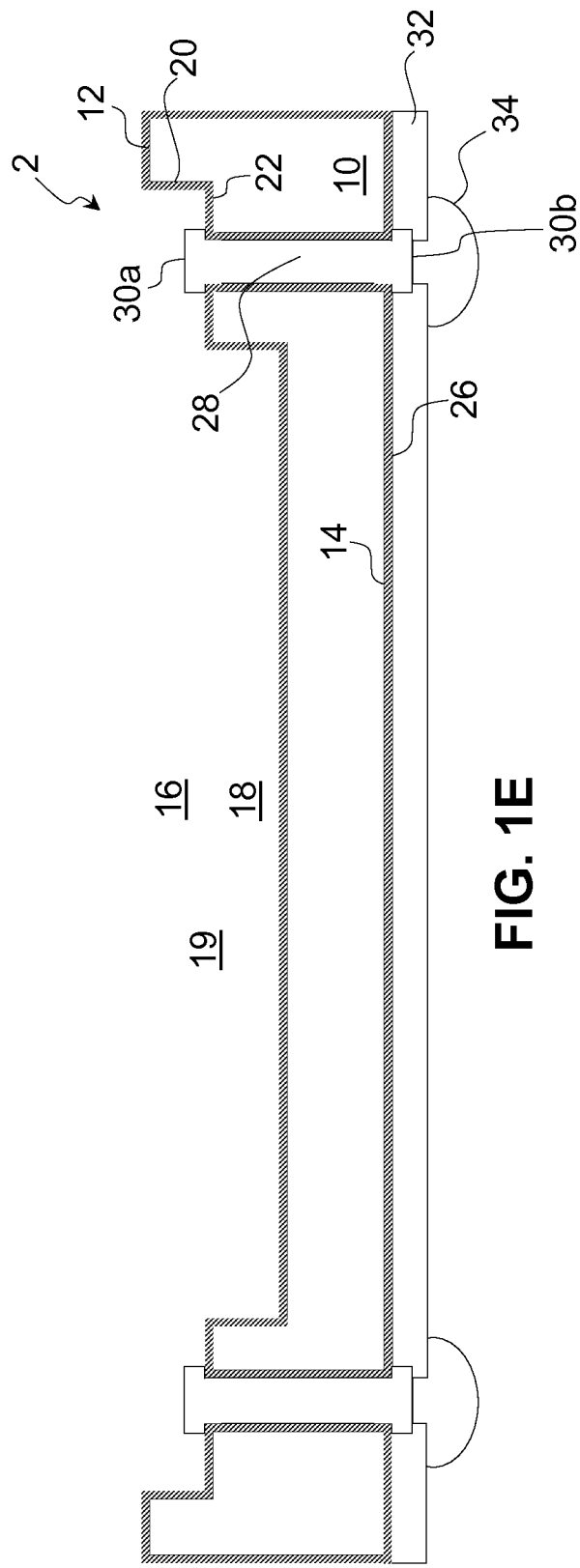

The formation of the handler assembly 2 is illustrated in FIGS. 1A-1E, and begins with a crystalline handler 10, which includes top and bottom surfaces 12 and 14, respectively, as shown in FIG. 1A. A first cavity 16 is formed into the top surface 12 of handler 10. Cavity 16 can be formed by the use of a laser, by a plasma etching process, by a sandblasting process, by a mechanical milling process, or by any other similar method. Preferably, cavity 16 is formed by performing a photo-lithography plasma etch process that removes a select exposed portion of handler 10. The plasma etch can be anisotropic, tapered, isotropic, or combinations thereof. A second cavity 18 is then formed into the bottom surface of the first cavity 16 using any of the above listed techniques for the first cavity 16. Preferably (but not necessarily) the depth of second cavity 18 is equal to or greater than the thickness of the image sensor chip 4, so that the sensor chip 4 can mostly or entirely fit within second cavity 18. The lateral dimensions (i.e. diameter, width, etc.) of the second cavity 18 are smaller than those of the first cavity 16, resulting in a stepped sidewall 20. The stepped sidewall 20 includes a step 22 extending laterally out toward the center of the cavities 16/18 to define a substantially laterally extending step surface 22a (i.e. the remaining portion(s) of the bottom surface of cavity 16) terminating at a substantially vertically extending surface 22b. Preferably, step 22 is continuous around the circumference of first cavity 16 (i.e. step 22 is in the form of an annular shoulder that defines the opening of second cavity 18 at the bottom surface of the first cavity 16). However, a plurality of discrete steps 22 could be formed that extend inwardly toward the center of first cavity 16 at discrete positions. Cavities 16 and 18 can be considered a single cavity 19 formed into top surface 12 (i.e. with a first cavity portion 16 disposed higher than the step surface 22a and a second cavity portion 18 disposed lower than the step surface 22a), with a stepped sidewall that defines at least one step surface 22a that extends inwardly inside the cavity. The resulting structure is illustrated in FIG. 1B.

Through-holes 24 are formed that extend through the handler 10 from the step surfaces 22a of steps 22 to bottom surface 14. Through-holes 24 can be formed by the use of a laser, by a plasma etching process, by a sandblasting process, by a mechanical milling process, or by any other similar method. Preferably, through-holes 24 are formed by photo-lithography plasma etching, which includes forming a layer of photo resist on the handler 10, patterning the photo resist layer to expose select portions of handler 10, and then performing a plasma etch process (e.g. BOSCH process, which uses a combination of SF6 and C4F8 gases) to remove the exposed portions of the handler 10 to form the through-holes 24. Preferably, each through hole 24 has a diameter between 5 to 250 μm, and a wall angle of 45 to 90 degrees relative to bottom surface 14. An isolation (dielectric) layer 26 is next deposited on the exposed surfaces of the handler, including within holes 24 and cavity 19. Dielectric layer 26 can be Si oxide, Si nitride, epoxy based, polyimide, resin, FR4, or any other appropriate dielectric material. Preferably, dielectric layer 26 is at least 0.1 μm in thickness, and is formed using any conventional dielectric layer deposition techniques (which are well known in the art). The resulting structure is shown in FIG. 1C.

A conductive material (e.g. Cu, Ti/Cu, Ti/Al, Cr/Cu, Cr/Al and/or any other well known conductive material(s)) is deposited on dielectric layer 26, filling or lining through-holes 24 with the conductive material. This deposition can be done by sputtering, plating, dispense printing or a combination of sputtering, plating and dispense processes. A photolithography step is then used to remove portions of the conductive material over portions of top and bottom surfaces 12/14 and inside cavity 19, leaving conductive elements or traces 28 extending through the through-holes 24 and terminating in conductive pads 30a and 30b at step surfaces 22a and surface 14, respectively. Conductive pads 30a and 30b have a greater lateral dimension that that of conductive elements 28 (to facilitate formation of electrical connections thereto), and can optionally extend along step surfaces 22a and/or 14 to reroute connections to accommodate specific design requirements. The resulting structure is illustrated in FIG. 1D.

An encapsulant (dielectric) layer 32 is next deposited over bottom surface 14. Dielectric layer 32 can be epoxy based, polyimide, resin, FR4, or any other appropriate dielectric material. Preferably, dielectric layer is at least 1.0 μm in thickness, and is formed using any conventional deposition technique (which are well known in the art). A photolithography process is then used to remove portions of layer 32 over conductive pads 30b. SMT (surface mount) interconnects 34 are next formed over bottom surface 14 in a manner such that they are in electrical contact with respective conductive pads 30b. SMT interconnects 34 can be BGA type, and formed using a screen printing process of a solder alloy, or by a ball placement process, or by a plating process. BGA (Ball Grid Array) interconnects are rounded conductors for making physical and electrical contact with counterpart conductors, usually formed by soldering or partially melting metallic balls onto contact pads. Alternately SMT interconnects 34 can be conductive metal posts (e.g. copper). The final handler assembly 2 structure is illustrated in FIG. 1E.

Figure 2C:
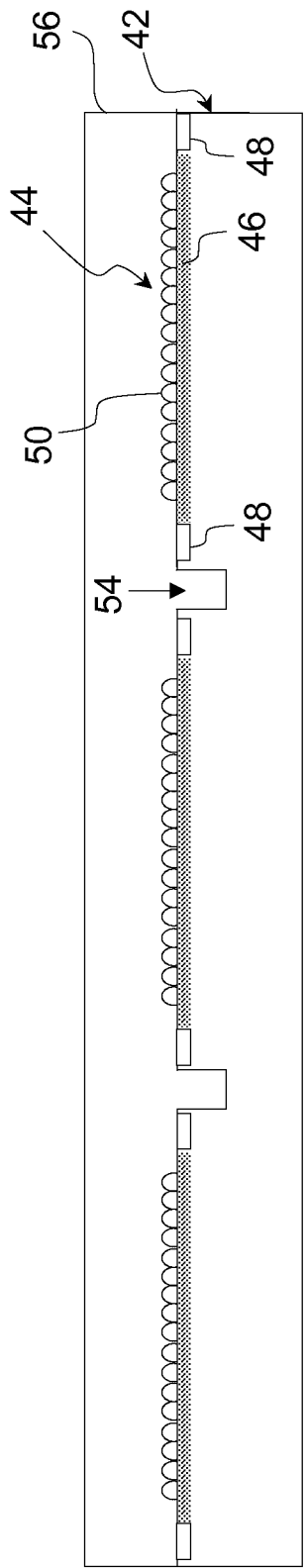

The formation of singulated image sensor chip 4 is illustrated in FIGS. 2A-2D, and begins with a wafer 42 having a front surface 43 on which a plurality of sensors 44 have been formed. Each sensor includes a plurality of photo detectors 46 (and supporting circuitry), along with contact pads 48. The photo detectors 46 (and supporting circuitry) and contact pads 48 are formed at the upwardly facing (front) surface 43 of wafer 42, as shown in FIG. 2A. The contact pads 48 are electrically connected to the photo detectors 46 (and/or their supporting circuitry) for providing off chip signaling. Each photo detector 46 converts light energy to a voltage signal. Additional circuitry may be included to amplify the voltage, and/or convert it to digital data. Color filters and/or microlenses 50 can be mounted over the photo detectors 46. Sensors of this type are well known in the art, and not further described herein.

A dicing tape 52 is mounted on the back side of image sensor wafer 42. The dicing tape 52 can be any tape or carrier made of PVC, polyolefin, polyethylene, ceramic or crystalline backing material with an adhesive to hold the dies in place. Dicing tape 52 is generally available in a variety of thicknesses (e.g. from 25 to 1000 μm), with a variety of adhesive strengths, designed for various chip sizes and materials. Partial dicing (pre-cutting) of shallow scribe line areas (streets) is next performed. Partial dicing involves cutting scribe lines 54 (i.e. trenches, channels, grooves, slots, etc.) into the front surface 43 of wafer 42. This cutting procedure can be implemented using a dicing saw, laser or etching process. Preferably, the cutting procedure is implemented using a dicing saw with dicing blade kerf width of 25 to 50 μm, where the depth of the scribe lines 54 extends no further than 30% of thickness of wafer 42. The resulting structure is shown in FIG. 2B.

Figure 2D:
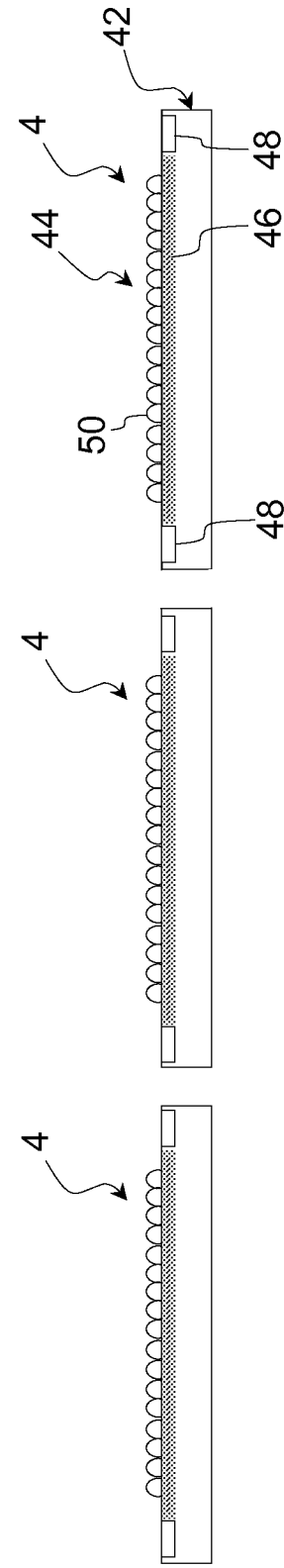

A temporary (sacrificial) protective layer 56 is then mounted on the front side of the wafer 42, and the dicing tape 52 is removed from the back side of wafer 42, as illustrated in FIG. 2C. The temporary protective layer 56 can be made of PVC, polyolefin, polyethylene, ceramic or crystalline backing material, with an adhesive to hold the dies in place after removing of dicing tape. The wafer 42 is then thinned from the back side until die separation has been completed (i.e. the sensors 44 are separated so that each is on its own die), preferably using wafer grinding and/or a silicon etch process. The protective layer 56 is then removed, leaving the final image sensor chips 4 as illustrated in FIG. 2D. The sensors 44 are then individually tested, so that only known good sensor chips 4 are packaged. Alternately, the sensors 44 can be tested before the sensor chips 4 are removed from the protective layer 56, where only known good sensor chips 4 are removed from the protective layer 56 and placed in trays for future assembly.

Figure 3A:
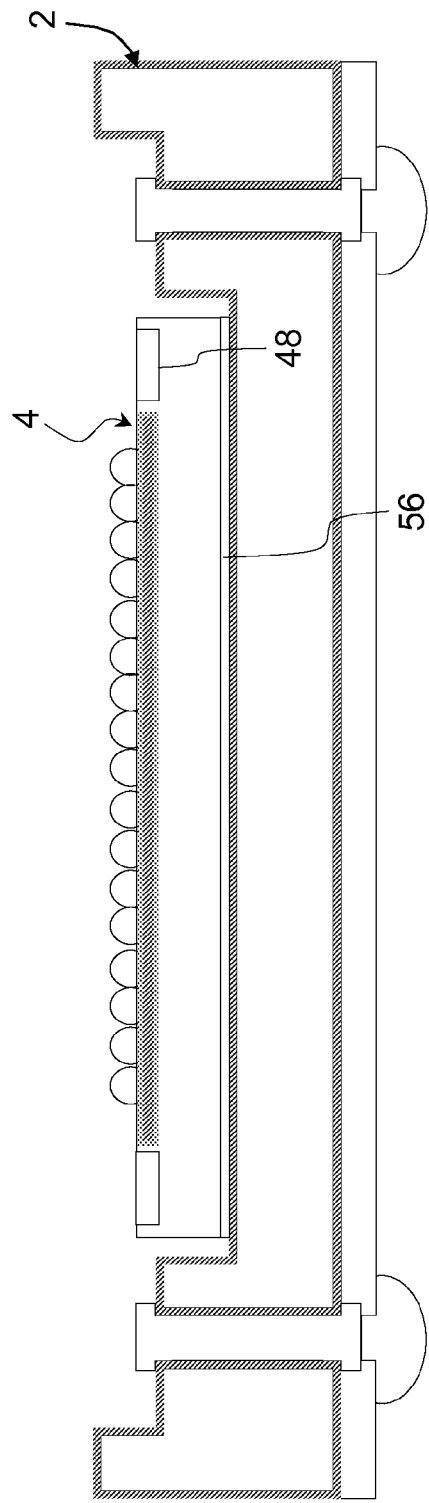
FIGS. 3A-3C are cross sectional side views showing the integration of the handler assembly and the image sensor chip.
Figure 3B:
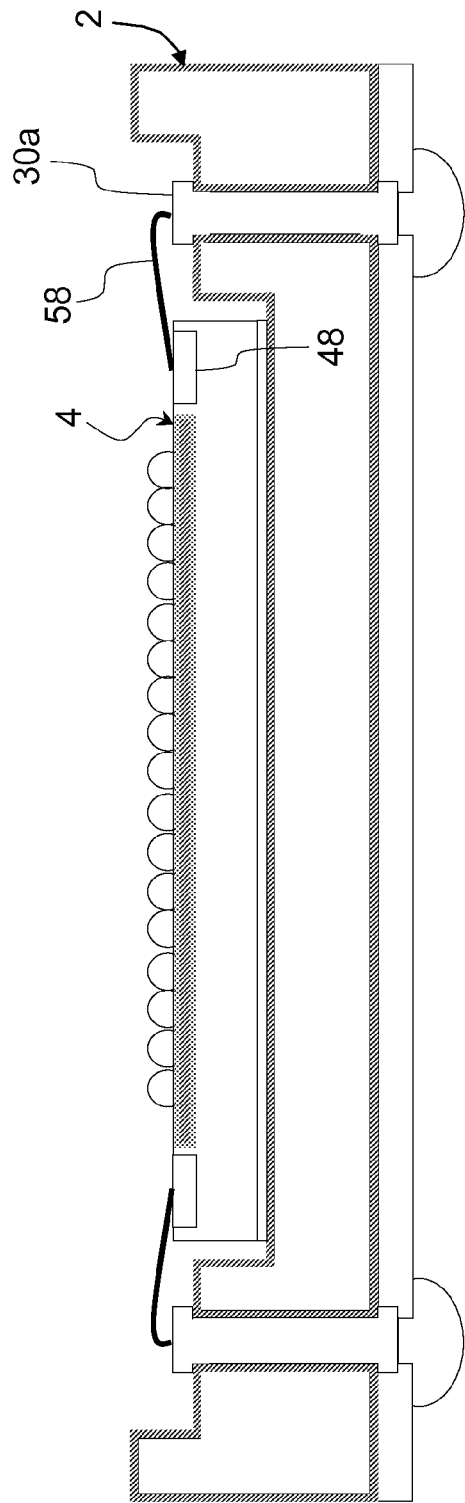
Figure 3C:
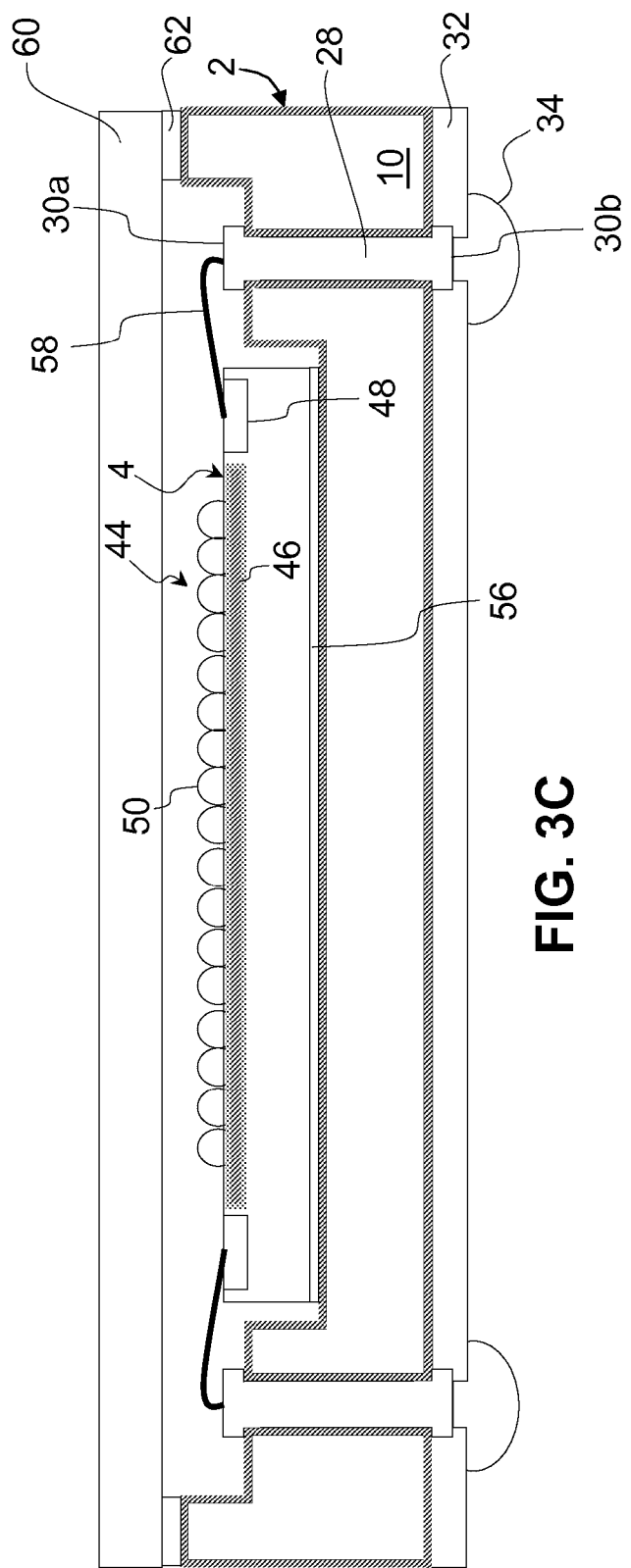

The separately formed handler assembly 2 and known good image sensor chip 4 are then integrated together as illustrated in FIGS. 3A-3C, whereby sensor chip 4 is placed in cavity 19 and attached to handler assembly 2. Any conventional die attach process may be used (e.g. conventional pick and place techniques), whereby a die attach material 56 (for example non-conductive adhesive film or epoxy with the nominal thickness of 1 to 25 micron and the ability to withstand curing temperatures up to 250 C, etc.) is used to affix sensor chip 4 to the bottom surface of second cavity 18, as illustrated in FIG. 3A. Preferably, but not necessarily, the front surface 43 of image sensor chip 4 is aligned with (i.e. even with) step surface(s) 22a, to better facilitate wire bonding described next. A wire bonding process is next performed, where wires 58 are connected between (and provide an electrical connection between) the contact pads 48 of the image sensor chip 4 and the respective conductive pads 30a of handler assembly 2, as illustrated in FIG. 3B. Wires 58 can be alloyed gold, copper or any other appropriate wire bonding material, and are formed by using any conventional wire bonding techniques (which are well known in the art).

An optically transparent substrate 60 is mounted to the top surface 12 of handler 10 so that substrate 60 is disposed over image sensor chip 4. Preferably, substrate 60 seals the opening of cavity 19. Substrate 60 can be made of polycrystalline ceramics (e.g. aluminum oxide ceramics, aluminum oxynitride, perovskytes, polycrystalline yttrium aluminum garnet, etc.), single crystalline ceramics, non-crystalline materials (e.g. inorganic glasses and polymers), glass ceramics (e.g. silicate based), etc., and is optically transparent to at least one range of light wavelengths. A joining material 62 can be used to affix substrate 60 to the top surface 12. Joining material 62 can be metal-based, epoxy based, polyimide, resin, or any other appropriate joining material(s). The resulting structure is shown in FIG. 3C.

The transparent substrate 60 and handler assembly 2 of the assembled packaging structure of FIG. 3C provide protection for sensor chip 4, and provide fan-out array electrical connections. In operation, sensor 44 receives the incoming light through the transparent substrate 60. Off chip conductivity is provided from each of the contact pads 48 on the image sensor chip 4, through the corresponding wire 58, the corresponding conductive pad 30a, the corresponding conductive trace 28, the corresponding conductive pad 30b, and finally the corresponding surface mount interconnect 34. Each of the three major components (handler assembly 2, transparent substrate 60, and image sensor chip 4) are fabricated separately for ease of manufacture and to ensure defective components can be discarded before being integrated (i.e. only known good components preferably make it to final integration), thus increasing yield and pass rates, and decreasing costs.

Figure 4A:
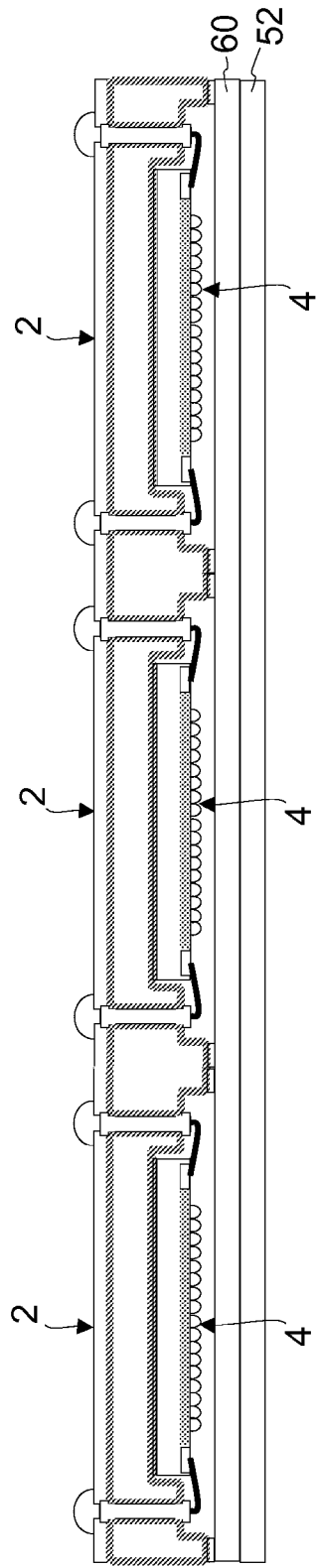
FIG. 4A is a cross sectional side view of the integrated handler assemblies, transparent substrate and image sensor chips before singulation.
Figure 4B:
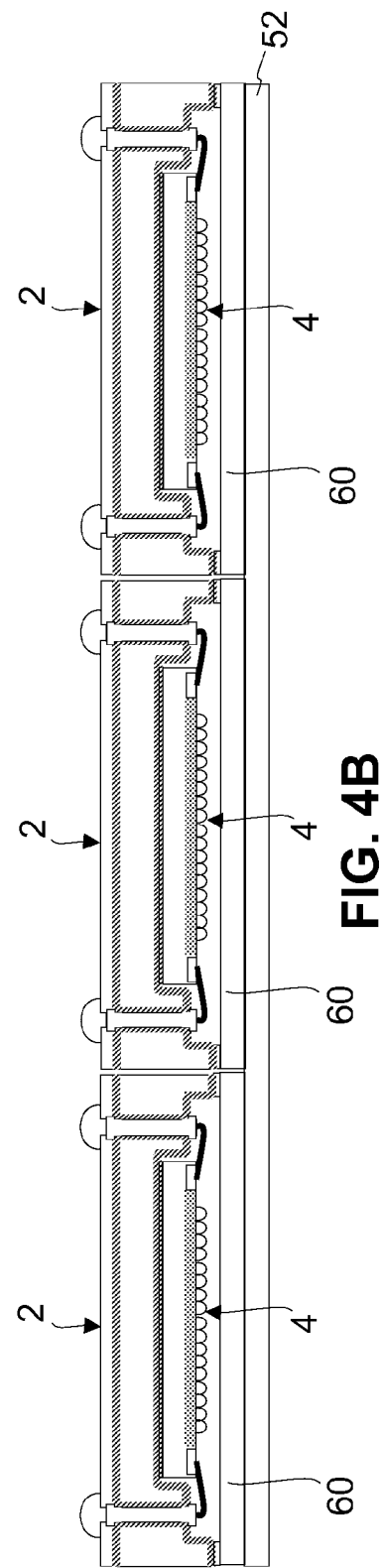
FIG. 4B is a cross sectional side view of the integrated handler assemblies, transparent substrate and image sensor chips after singulation.

Preferably, multiple handler assemblies 2 are formed on a single crystalline handler 10, and a single transparent substrate 60 is used for the multiple handler assemblies. The above described integration can therefore be performed before handler 10 and substrate 30 are singulated into individual assemblies, or afterward. If integration is performed before singulation, then the pre-singulation structure is shown in FIG. 4A (with dicing tape 52 mounted to the transparent substrate 60). A wafer dicing process is then performed (e.g. using wafer dicing and/or laser equipment) to singulate the assemblies as shown in FIG. 4B.

Figure 5:
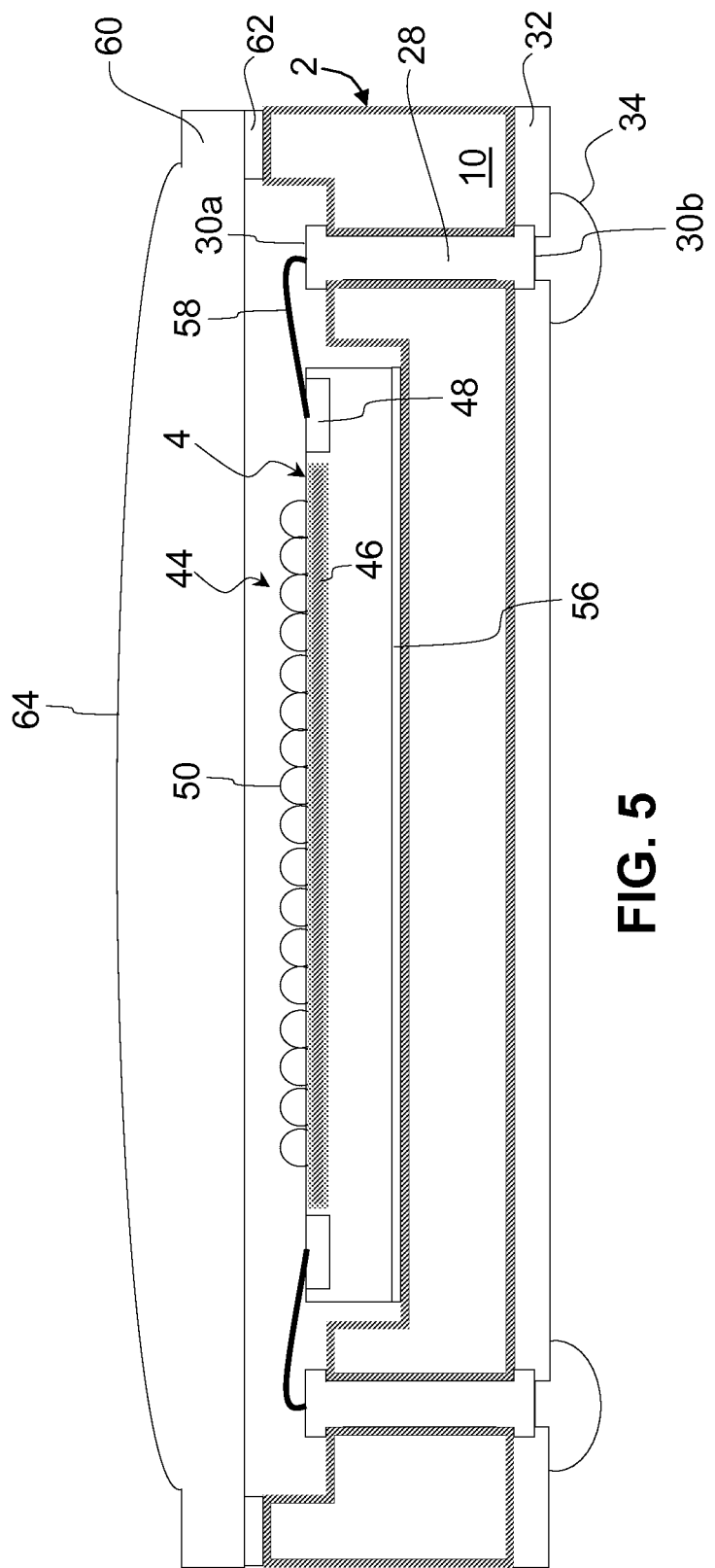
FIG. 5 is a cross sectional side view of an alternate embodiment of the integrated handler assembly, the transparent substrate and the image sensor chip, where the transparent substrate includes an integrally formed lens at its top surface.

FIG. 5 illustrates an alternate embodiment, in which the top surface 64 of transparent substrate 60 is non-planar such that it acts as a lens for the light entering substrate 60. The distance between the lens substrate 60 and the active surface of the sensor 44 is fixed, and can be optimized during assembly by changing the thickness of joining material 62.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order separately or simultaneously that allows the proper formation of the image sensor packaging of the present invention. Single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. An image sensor package, comprising:
   a handler assembly that includes:
   a crystalline handler having opposing first and second surfaces, wherein the crystalline handler includes a cavity formed into the first surface such that the cavity has a stepped sidewall that defines at least one step surface extending inwardly inside the cavity, and
   a plurality of conductive elements each extending from the at least one step surface, through the crystalline handler, to the second surface;
   a sensor chip disposed in the cavity, wherein the sensor chip includes:
   a substrate with front and back opposing surfaces,
   a plurality of photo detectors formed at the front surface, and
   a plurality of contact pads formed at the front surface which are electrically coupled to the photo detectors;
   a plurality of wires each extending between and electrically connecting one of the contact pads and one of the conductive elements; and
   a substrate disposed over the cavity and mounted to the crystalline handler, wherein the substrate is optically transparent to at least one range of light wavelengths.

2. The image sensor package of claim 1, further comprising:
   a plurality of surface mount interconnects each disposed over the second surface of the crystalline handler, and each electrically connected to one of the conductive elements.

3. The image sensor package of claim 2, wherein for each of the conductive elements:
   the conductive element terminates at the at least one step surface in a first conductive pad, wherein one of the wires is connected to the first conductive pad; and
   the conductive element terminates at the second surface in a second conductive pad, wherein one of the surface mount interconnects is connected to the second conductive pad;
   wherein the first and second conductive pads each have a lateral dimension that is greater than that of the conductive element.

4. The image sensor package of claim 1, wherein the sensor chip further comprises:
   a plurality of color filters and microlenses mounted over the photo detectors.

5. The image sensor package of claim 1, wherein the substrate has a surface with a portion thereof that is disposed over the photo detectors and is non-planar.

6. The image sensor package of claim 1, wherein the plurality of conductive elements are insulated from the crystalline handler by a dielectric material.

7. The image sensor package of claim 1, wherein:
   the cavity has a first portion disposed higher than the step surface and a second portion disposed lower than the step surface;
   the second portion has a lateral dimension that is smaller than that of the first portion; and
   the sensor chip is disposed in the second portion.

8. The image sensor package of claim 7, wherein the sensor chip is disposed entirely within the second portion.

9. A method of packaging a sensor chip that includes a substrate with front and back opposing surfaces, a plurality of photo detectors formed at the front surface, and a plurality of contact pads formed at the front surface which are electrically coupled to the photo detectors, the method comprising:
   providing a crystalline handler having opposing first and second surfaces;
   forming a cavity into the first surface such that the cavity has a stepped sidewall that defines at least one step surface extending inwardly inside the cavity;
   forming a plurality of conductive elements each extending from the at least one step surface, through the crystalline handler, to the second surface;
   inserting the sensor chip in the cavity;
   affixing a plurality of wires between the sensor chip and the plurality of conductive elements such that each of the wires extends between and electrically connects one of the contact pads and one of the conductive elements; and
   mounting a substrate to the crystalline handler such that the substrate is disposed over the cavity, wherein the substrate is optically transparent to at least one range of light wavelengths.

10. The method of claim 9, further comprising:
    forming a plurality of surface mount interconnects each disposed over the second surface of the crystalline handler, and each electrically connected to one of the conductive elements.

11. The method of claim 10, wherein each of the plurality of conductive elements is formed such that:
    the conductive element terminates at the at least one step surface in a first conductive pad, wherein one of the wires is connected to the first conductive pad; and
    the conductive element terminates at the second surface in a second conductive pad, wherein one of the surface mount interconnects is connected to the second conductive pad;
    wherein the first and second conductive pads each have a lateral dimension that is greater than that of the conductive element.

12. The method of claim 9, wherein the substrate has a surface with a portion thereof that is disposed over the photo detectors and is non-planar.

13. The method of claim 9, further comprising:
    forming a dielectric material between the plurality of conductive elements and the crystalline handler.

14. The method of claim 9, wherein the forming of the cavity comprises:
    forming a first portion of the cavity into the first surface, wherein the first portion has a first lateral dimension and a bottom surface;
    forming a second portion of the cavity into the bottom surface of the first portion, wherein the second portion has a second lateral dimension that is smaller than the first lateral dimension, wherein at least one portion of the bottom surface remains after the second portion is formed and which constitutes the at least one step surface.

15. The method of claim 14, wherein the inserting the sensor chip in the cavity includes inserting the sensor chip in the second portion of the cavity.

16. The method of claim 14, wherein the inserting the sensor chip in the cavity includes inserting the sensor chip entirely within the second portion of the cavity.

17. The method of claim 9, wherein the forming of each of the conductive elements comprises:
    forming a hole that extends from the at least one step surface to the second surface;
    forming an insulation material along a sidewall of the hole; and
    depositing conductive material in the hole.

18. A method of forming a plurality of image sensor packages, comprising:
    providing a crystalline handler having opposing first and second surfaces;
    forming a plurality of cavities into the first surface such that each of the cavities has a stepped sidewall that defines at least one step surface extending inwardly inside the cavity;
    for each of the cavities, forming a plurality of conductive elements each extending from the at least one step surface, through the crystalline handler, to the second surface;
    inserting a sensor chip in each of the cavities, wherein each of the sensor chips includes:
        a substrate with front and back opposing surfaces,
        a plurality of photo detectors formed at the front surface, and
        a plurality of contact pads formed at the front surface which are electrically coupled to the photo detectors;
    for each of the respective sensor chips and cavities, affixing a plurality of wires between the sensor chip and the plurality of conductive elements such that each of the wires extends between and electrically connects one of the contact pads and one of the conductive elements;
    mounting a substrate to the crystalline handler such that the substrate is disposed over the cavities, wherein the substrate is optically transparent to at least one range of light wavelengths; and
    cutting the crystalline handler and substrate to form separate packages each including one of the cavities and one of the sensor chips therein.

19. The method of claim 18, further comprising:
    forming a plurality of surface mount interconnects each disposed over the second surface of the crystalline handler, and each electrically connected to one of the conductive elements.

20. The method of claim 18, wherein portions of the substrate top surface disposed over the sensor chips are non-planar, wherein the substrate has a surface with portions thereof that each is disposed over one of the photo detectors and is non-planar.

21. The method of claim 18, wherein for each of the cavities, each of the plurality of conductive elements is formed such that:
    the conductive element terminates at the at least one step surface in a first conductive pad, wherein one of the wires is connected to the first conductive pad; and
    the conductive element terminates at the second surface in a second conductive pad, wherein one of the surface mount interconnects is connected to the second conductive pad;
    wherein the first and second conductive pads each have a lateral dimension that is greater than that of the conductive element.

22. The method of claim 18, further comprising:
    forming a dielectric material between the plurality of conductive elements and the crystalline handler.

23. The method of claim 18, wherein the forming of each of the cavities comprises:
    forming a first portion of the cavity into the first surface, wherein the first portion has a first lateral dimension and a bottom surface;
    forming a second portion of the cavity into the bottom surface of the first portion, wherein the second portion has a second lateral dimension that is smaller than the first lateral dimension, and wherein at least one portion of the bottom surface remains after the second portion is formed and which constitutes the at least one step surface.

24. The method of claim 23, wherein the inserting the sensor chips in the cavities includes inserting the sensor chips in the second portions of the cavities.

25. The method of claim 23, wherein the inserting the sensor chips in the cavities includes inserting the sensor chips entirely within the second portions of the cavities.

26. The method of claim 18, wherein for each of the cavities, the forming of each of the conductive elements comprises:
    forming a hole that extends from the at least one step surface to the second surface; and
    forming an insulation material along a sidewall of the hole; and
    depositing conductive material in the hole.

\* \* \* \* \*